US010869362B2

(12) United States Patent
Huang et al.

(10) Patent No.: US 10,869,362 B2
(45) Date of Patent: *Dec. 15, 2020

(54) WLAN FRONT-END

(71) Applicant: SKYWORKS SOLUTIONS, INC., Woburn, MA (US)

(72) Inventors: Chun-Wen Paul Huang, Methuen, MA (US); Lui Lam, Lexington, MA (US); Mark M. Doherty, Westford, MA (US); Michael Joseph McPartlin, North Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/208,844

(22) Filed: Dec. 4, 2018

(65) Prior Publication Data

US 2019/0182894 A1   Jun. 13, 2019

Related U.S. Application Data

(63) Continuation of application No. 14/989,117, filed on Jan. 6, 2016, now Pat. No. 10,149,347.

(Continued)

(51) Int. Cl.
*H04W 84/12* (2009.01)
*H03F 3/193* (2006.01)
(Continued)

(52) U.S. Cl.
CPC ............ *H04W 84/12* (2013.01); *H01L 21/76* (2013.01); *H03F 3/191* (2013.01); *H03F 3/193* (2013.01);
(Continued)

(58) Field of Classification Search
CPC .......... H04W 84/12; H03F 3/72; H03F 3/191; H03F 3/211; H03F 3/245; H03F 3/195;
(Continued)

(56) References Cited

U.S. PATENT DOCUMENTS 10,149,347 B2 * 12/2018 Huang .................... H03F 3/193
2013/0043946 A1 * 2/2013 Hadjichristos ...... H03F 3/45179
330/252

(Continued)

FOREIGN PATENT DOCUMENTS

CN          103368601 A     10/2013
WO          2014004535 A1    1/2014

OTHER PUBLICATIONS

Huang et al., "A highly integrated single chip 5-6 GHz front-end IC based on SiGe BiCMOS that enhances 802.11ac WLAN radio front-end designs," Radio Frequency Integrated Circuits Symposium (RFIC), 2015 IEEE, pp. 227-230, Phoenix, AZ.

(Continued)

*Primary Examiner* — Walli Z Butt
(74) *Attorney, Agent, or Firm* — Chang & Hale LLP

(57) ABSTRACT

In some embodiments, a wireless local area network (WLAN) front-end can be implemented on a semiconductor die having a semiconductor substrate, and a power amplifier implemented on the semiconductor substrate and configured for WLAN transmit operation associated with a frequency range. The semiconductor die can further include a low-noise amplifier (LNA) implemented on the semiconductor substrate and configured for WLAN receive operation associated with the frequency range. The semiconductor die can further include a transmit/receive switch implemented on the semiconductor substrate and configured to support the transmit and receive operations.

18 Claims, 10 Drawing Sheets

Related U.S. Application Data

(60) Provisional application No. 62/100,659, filed on Jan. 7, 2015.

(51) Int. Cl.
| | | |
|---|---|---|
| *H03F 3/195* | (2006.01) | |
| *H03F 3/24* | (2006.01) | |
| *H04B 7/0413* | (2017.01) | |
| *H01L 21/76* | (2006.01) | |
| *H03F 3/21* | (2006.01) | |
| *H03F 3/191* | (2006.01) | |
| *H03F 3/72* | (2006.01) | |

(52) U.S. Cl.
CPC ............ *H03F 3/195* (2013.01); *H03F 3/211* (2013.01); *H03F 3/245* (2013.01); *H03F 3/72* (2013.01); *H04B 7/0413* (2013.01); *H03F 2200/105* (2013.01); *H03F 2200/111* (2013.01); *H03F 2200/18* (2013.01); *H03F 2200/294* (2013.01); *H03F 2200/408* (2013.01); *H03F 2200/417* (2013.01); *H03F 2200/451* (2013.01); *H03F 2203/7209* (2013.01)

(58) Field of Classification Search
CPC ............ H03F 3/193; H03F 2203/7209; H03F 2200/111; H03F 2200/408; H03F 2200/417; H03F 2200/294; H03F 2200/18; H03F 2200/105; H03F 2200/451; H01L 21/76; H04B 7/0413
See application file for complete search history.

(56) References Cited

U.S. PATENT DOCUMENTS

| | | | |
|---|---|---|---|
| 2014/0002187 A1* | 1/2014 | McPartlin | H01L 29/7378 330/250 |
| 2014/0087671 A1 | 3/2014 | Mostov et al. | |
| 2014/0191806 A1* | 7/2014 | Ding | H03F 1/0266 330/296 |
| 2016/0072456 A1* | 3/2016 | Lin | H03F 1/565 330/303 |

OTHER PUBLICATIONS

Yamamoto et al., "A 2A-GHz-band 1.8-V operation single-chip Si-CMOS T/R-MMIC front-end with a low insertion loss switch," IEEE Journal of Solid-State Circuits, Aug. 2001, pp. 1186-1197, vol. 36, No. 8.

Huang et al, "A compact 5-6 GHz T/R module based on SiGe BiCMOS and SOI that enhances 256 QAM 802.11ac WLAN radio front-end designs," Wireless and Microwave Technology Conference (WAMICON), IEEE 15th Annual, 2014, pp. 1-4, Tampa, FL.

Stamper et al., "High-resistivity SiGe BiCMOS technology development," 2014 IEEE Bipolar/BiCMOS Circuits and Technology Meeting (BCTM), 2014, pp. 25-28, Coronado, CA.

Wu et al., "GaAs Bi-FET RF front-end MMIC for WiMAX applications," 2012 IEEE Radio Frequency Integrated Circuits Symposium, 2012, pp. 287-290, Montreal, QC.

* cited by examiner

WLAN FRONT-END

CROSS-REFERENCE TO RELATED APPLICATION(S)

This application is a continuation of U.S. application Ser. No. 14/989,117 filed Jan. 6, 2016, entitled FRONT-END INTEGRATED CIRCUIT FOR WLAN APPLICATIONS, which claims priority to U.S. Provisional Application No. 62/100,659 filed Jan. 7, 2015, entitled HIGHLY INTEGRATED SINGLE CHIP FRONT-END IC BASED ON SIGE BICMOS, the benefits of the filing dates of which are hereby claimed and the disclosures of which are hereby expressly incorporated by reference herein in their entirety.

BACKGROUND

Field

The present disclosure relates to front-end designs for radio-frequency (RF) applications.

Description of the Related Art

Many electronic devices include circuits and components configured to provide wireless local area network (WLAN) functionality. Such a WLAN functionality allows an electronic device to communicate with one or more other devices in a wireless manner.

SUMMARY

According to a number of implementations, the present disclosure relates to a semiconductor die that includes a semiconductor substrate, and a power amplifier implemented on the semiconductor substrate and configured for wireless local area network (WLAN) transmit operation associated with a frequency range. The semiconductor die further includes a low-noise amplifier (LNA) implemented on the semiconductor substrate and configured for WLAN receive operation associated with the frequency range. The semiconductor die further includes a transmit/receive switch implemented on the semiconductor substrate and configured to facilitate the transmit and receive operations.

In some embodiments, the frequency range can include a WLAN frequency range of 4.9 GHz to 5.9 GHz.

In some embodiments, the semiconductor substrate can be configured to allow implementation of silicon germanium (SiGe) BiCMOS process technology. The power amplifier can be implemented as a SiGe power amplifier having a plurality of stages. The plurality of stages can include a first stage having a first amplifying transistor, a second stage having a second amplifying transistor, and a third stage having a third amplifying transistor. Each of the first amplifying transistor, the second amplifying transistor, and the third amplifying transistor can be configured to receive an input signal through its base and generate an amplified signal through its collector, such that an input radio-frequency (RF) signal for the SiGe power amplifier is provided to the base of the first amplifying transistor, and an amplified RF signal from the SiGe power amplifier is obtained through the collector of the third amplifying transistor.

In some embodiments, the semiconductor die can further include one or more matching network circuits implemented before the plurality of stages, between stages, and/or after the plurality of stages.

In some embodiments, the semiconductor die can further include a CMOS controller configured to provide control functionality for the SiGe power amplifier.

In some embodiments, the semiconductor die can further include one or more bias circuits configured to provide bias signals to the plurality of stages. At least some of the one or more bias circuits can be configured to provide either or both of on-die temperature and voltage compensation functionalities.

In some embodiments, the semiconductor die can further include a power detector configured to measure power associated with the SiGe power amplifier. Such a power detector can be, for example, a log detector.

In some embodiments, the LNA can be implemented in a cascode configuration with a first transistor and a second transistor. The first transistor can be configured to operate as a common source device, and the second transistor can be configured to operate as a common gate device. The LNA can be configured such that an input RF signal is provided to a gate of the first transistor and the amplified RF signal output through its drain, with the amplified signal from the drain of the first transistor being provided to a source of the second transistor for further amplification and output through a drain of the second transistor.

In some embodiments, the LNA can include a bypass circuit implemented between the gate of the first transistor and the drain of the second transistor. The bypass circuit can include first and second transistors arranged in series with an attenuation resistance implemented between the first and second transistors. In some embodiments, the LNA can further include one or more trap filters.

In some embodiments, the transmit/receive switch can be implemented to include a pole in communication with an antenna, a first throw in communication with the LNA, and a second throw in communication with the power amplifier. The transmit/receive switch can include a first series path between the pole and the first throw, and a second series path between the pole and the second throw. Each of the first and second series paths can include a plurality of field-effect transistors (FETs) arranged in series and configured to be turned ON for passing of an RF signal and turned OFF to block passage of an RF signal.

In some embodiments, the transmit/receive switch can further include a first shunt path between the first throw and an AC ground, and a second shunt path between the second throw and the AC ground. Each of the first and second shunt paths can include a plurality of FETs arranged in series and configured to be turned ON when the corresponding series path is OFF, and to be turned OFF when the series path is ON. Each FET of the first and second series paths and the first and second shunt paths can be implemented as a MOSFET device having a multi-gate configuration.

In some implementations, the present disclosure relates to a method for fabricating a semiconductor die. The method includes forming or providing a semiconductor substrate, and implementing a power amplifier on the semiconductor substrate. The power amplifier is configured for wireless local area network (WLAN) transmit operation associated with a frequency range. The method further includes forming a low-noise amplifier (LNA) on the semiconductor substrate. The LNA is configured for WLAN receive operation associated with the frequency range. The method further includes implementing a transmit/receive switch on the semiconductor substrate. The transmit/receive switch is configured to facilitate the transmit and receive operations.

According to some teachings, the present disclosure relates to a radio-frequency (RF) module that includes a packaging substrate configured to receive a plurality of components, and a front-end integrated circuit (FEIC) implemented on a die that is mounted on the packaging substrate. The die includes a semiconductor substrate and a power amplifier implemented on the semiconductor substrate and configured for wireless local area network (WLAN) transmit operation associated with a frequency range. The die further includes a low-noise amplifier (LNA) implemented on the semiconductor substrate and configured for WLAN receive operation associated with the frequency range. The die further includes a transmit/receive switch implemented on the semiconductor substrate and configured to facilitate the transmit and receive operations.

In some embodiments, the frequency range includes a high WLAN frequency range of 4.9 GHz to 5.9 GHz. In some embodiments, the RF module can further include a second die mounted on the packaging substrate. The second die can include an FEIC configured for transmit and receive operations associated with a second frequency range, and the FEIC can include a power amplifier, an LNA, and a transmit/receive switch. In some embodiments, the second frequency range can include a low WLAN frequency range of 2.4 GHz to 2.5 GHz.

In some embodiments, the transmit/receive switch of the second die can be configured to allow routing of an RF signal associated with a short-range personal area network through the second die.

In some embodiments, the RF module can further include a diplexer implemented to allow simultaneous operation of the RF module in the high and low WLAN frequency ranges. In some embodiments, the RF module can further include one or more of the die configured for operation in the high WLAN frequency range to provide multiple-input multiple-output (MIMO) functionality.

In accordance with some implementations, the present disclosure relates to a wireless device having a transceiver, and a front-end integrated circuit (FEIC) in communication with the transceiver and implemented on a die. The die includes a semiconductor substrate, and a power amplifier implemented on the semiconductor substrate and configured for wireless local area network (WLAN) transmit operation associated with a frequency range. The die further includes a low-noise amplifier (LNA) implemented on the semiconductor substrate and configured for WLAN receive operation associated with the frequency range. The die further includes a transmit/receive switch implemented on the semiconductor substrate and configured to facilitate the transmit and receive operations. The wireless device further includes an antenna in communication with the die and configured to facilitate the transmit and receive operations.

In some embodiments, the FEIC can be implemented on a front-end module. In some embodiments, the wireless device can further include a cellular FEIC and a cellular antenna configured for cellular transmit and receive operations.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
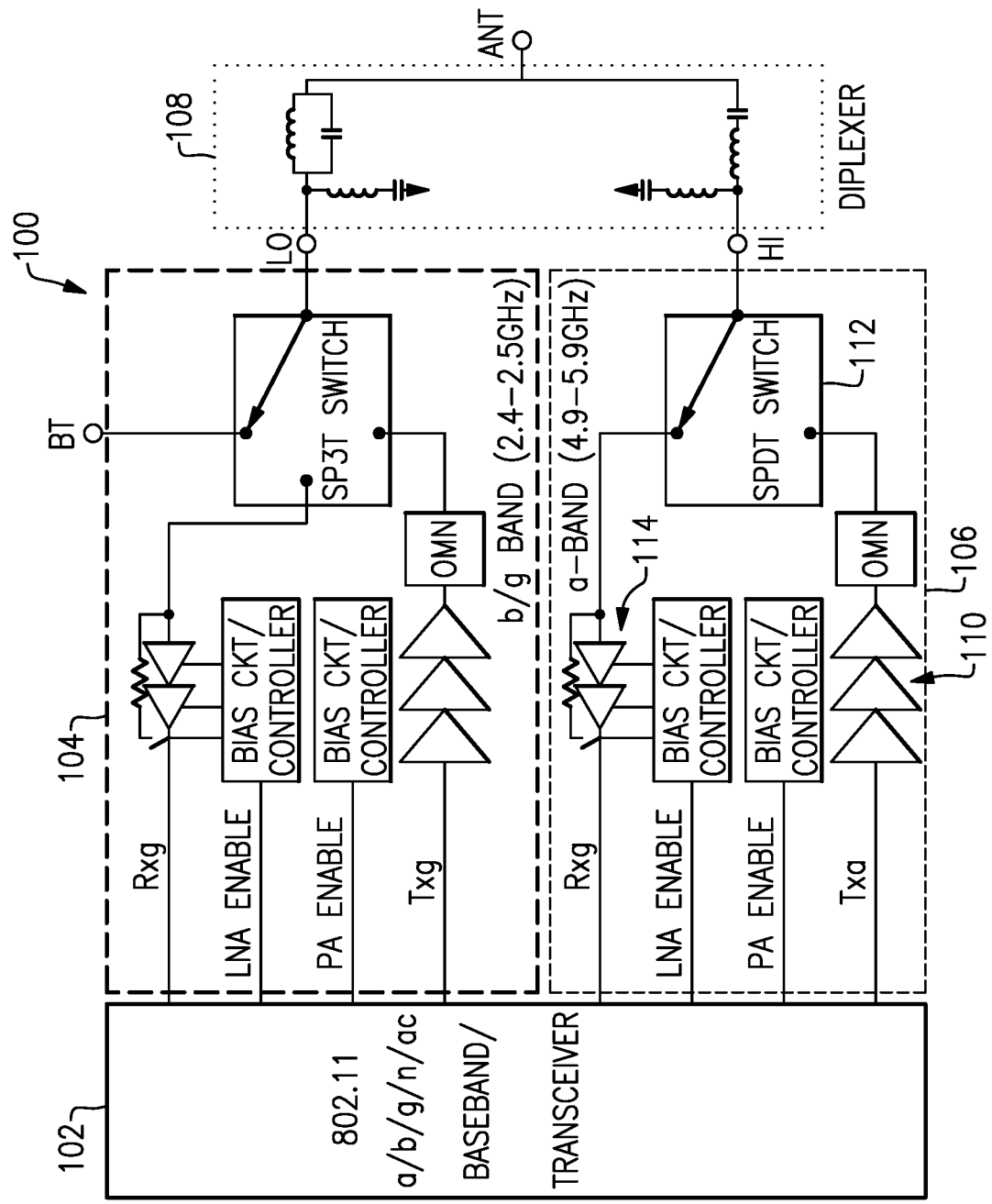
FIG. 1 shows an example of a dual-band front-end (FE) system having a transceiver/baseband block, a first band block, a second band block, and a diplexer block implemented to provide a dual-band functionality for WLAN applications.

The headings provided herein, if any, are for convenience only and do not necessarily affect the scope or meaning of the claimed invention.

Disclosed herein are various examples related to a front-end (FE) integrated circuit (IC) that can be implemented for wireless local area network (WLAN) applications. Although described in such radio-frequency (RF) applications, it will be understood that one or more features of the present disclosure can also be implemented for other types of RF applications, including but not limited to cellular applications.

As a specific example of a WLAN design, disclosed herein are examples related to a highly integrated single chip having a 5-6 GHz front-end IC based on silicon-germanium (SiGe) BiCMOS that can enhance 802.11ac WLAN front-end designs. In the context of such a specific example, a highly integrated 4.9-5.9 GHz single chip front-end IC (FEIC) can be implemented based on SiGe BiCMOS technology. Such a single chip can be realized in, for example, a 1.6 mm² chip area and in a compact 1.7×2.0×0.33 mm³ package. In such an FEIC, a transmit (Tx) chain can have a gain greater than 30 dB, and meet approximately −40 dB DEVM (dynamic error vector magnitude) up to 15 dBm and approximately −35 dB DEVM up to 17 dBm with a 3.3 V supply. Such an FEIC can also be substantially insensitive to modulation bandwidths and duty cycle. The foregoing ultra-low back-off DEVM can enable, for example, 1024-QAM applications. As described herein, an integrated log detector can enhance the dynamic range for the transmit power control. A receive (Rx) chain can include a noise factor (NF) less than 2.8 dB, and a 15 dB gain with 3 dBm IIP3 (input third-order intercept point) and 8 dB bypass attenuator with 24 dBm IIP3. As described herein, some or all of the foregoing features can enhance front-end circuit designs of complex 802.11ac radios. It will be understood that one or more features of the present disclosure can also be implemented with other values or ranges of design and/or performance parameters.

RF applications such as WLAN applications are examples of fast growing areas in data communication technologies. In earlier designs, WLAN radios were implemented for computer networking, but currently WLAN designs are being used in many other communication electronics. Demands of more bandwidth and higher throughput rates can be addressed by development and applications of multiple-input multiple-output (MIMO) techniques to increase the data rate from, for example, earlier 54 Mbps of a single-input single-output (SISO) radio to 108 Mbps.

For further demands of wider bandwidths and higher data throughput, techniques such as the 802.11ac standard can provide up to 780 Mbps per transmit/receive capability. Further, when 802.11ac radios operate in MIMO modes, the data rate can be up to 6 Gbps.

Earlier generations of WLAN and MIMO radios typically operate in a 2.4-2.5 GHz b/g band. With the continually increasing demands for bandwidth and higher data throughput rates, dual-band WLAN radios are utilized in more recent computers and portable communication electronics. Reasons for using dual-band WLAN radios can include, for example, a feature where a high band (e.g., a-band radio operating at 4.9-5.9 GHz) can provide more frequency channels. In addition, dual-band WLAN radios can be configured to support concurrent operation, thereby allowing the low and high band radios to operate simultaneously and therefore result in significantly increased data throughput.

FIG. 1 shows an example of a dual-band front-end (FE) system 100 having a transceiver/baseband block 102, a first band block 104, a second band block 106, and a diplexer block 108 implemented to provide a dual-band functionality for WLAN applications. For the purpose of description herein, it will be understood that a given band can have one or more channels therein.

In the example of FIG. 1, the transceiver/baseband block 102 can be configured to provide baseband and transceiver functionalities for bands including those associated with the first and second band blocks 104, 106. As shown in FIG. 1, such a block can be configured to generate an RF signal for transmission through each of the first and second band blocks 104, 106. As also shown in FIG. 1, the block 102 can be configured to process an RF signal received through each of the first and second band blocks 104, 106.

For example, the transceiver/baseband block 102 is depicted as being configured to be capable of processing 802.11 channels a, b, g, n and/or ac. The first band block 104 is depicted as a low band block configured to perform Tx and Rx operations for b/g bands (2.4-2.5 GHz). The second band block 106 is depicted as a high band block configured to perform Tx and Rx operations for a band (4.9-5.9 GHz).

For the low band block 104, an RF signal to be transmitted is shown to be generated by the transceiver 102 and provided to a power amplifier (PA) having one or more stages. Such a PA can be biased by a controller that can receive control signals from the transceiver 102. The amplified RF signal can be routed to an antenna port (ANT) through, for example, an output matching network (OMN), a Tx/Rx switch, and a diplexer 108.

For the low band block 104, an RF signal received through the antenna port (ANT) is shown to be routed to a low-noise amplifier (LNA) having or more stages, through the diplexer 108 and the Tx/Rx switch. Such an LNA can be biased by a controller that can receive control signals from the transceiver 102. The LNA-amplified RF signal can be routed to the transceiver 102.

In the example low band block 104, the Tx/Rx switch is shown to be implemented in a single-pole-triple-throw (SP3T) configuration. The pole can be coupled to the diplexer 108, and the three throws can be coupled to the PA, the LNA, and a short-range personal area network circuit (indicated as BT).

Similarly, for the high band block 106, an RF signal to be transmitted is shown to be generated by the transceiver 102 and provided to a power amplifier (PA) having one or more stages. Such a PA can be biased by a controller that can receive control signals from the transceiver 102. The amplified RF signal can be routed to an antenna port (ANT) through, for example, an output matching network (OMN), a Tx/Rx switch, and the diplexer 108.

Similarly, for the high band block 106, an RF signal received through the antenna port (ANT) is shown to be routed to a low-noise amplifier (LNA) having or more stages, through the diplexer 108 and the Tx/Rx switch. Such an LNA can be biased by a controller that can receive control signals from the transceiver 102. The LNA-amplified RF signal can be routed to the transceiver 102.

In the example of FIG. 1, the low and high band paths can be combined with the diplexer 108 to increase selectivity of each band prior to connection to the dual-band antenna port (ANT). In some embodiments, a dual-band MIMO front-end (FE) design can be implemented by addition of one or more of the topology shown in FIG. 1.

In some wireless applications, embedded WLAN radios in portable electronic devices require or specify more compact and integrated designs than, for example, WLAN radios utilized in computer networking applications. In some embodiments, a front-end module (FEM) is often a preferred design implementation for providing some or all of WLAN functionalities. For example, in applications where MIMO is used in portable electronics, implementations in FEMs can simplify designs and RF-related printed circuit board (PCB) layouts, as well as reduce the number of components in multi-channel MIMO configurations.

In many WLAN radio applications, there is a trend of higher integration FEM designs with smaller sizes. For example, a high linearity FEM can be implemented in a 2.3×2.3×0.33 mm³ QFN package, and such a module can be based on a design where a SiGe PA is implemented on one die and a silicon-on-insulator (SOI) switch LNA is implemented on another die. To implement further FEM size reduction, such a two-chip silicon design can be challenging.

As disclosed herein, transmit (Tx) and receive (Rx) paths can be fully integrated into a single-die FEIC design, and such a design can be implemented in, for example, a 1.7×2.0×0.33 mm³ package for a compact radio front-end circuit design. In the example of FIG. 1, such a single-die FEIC design can include the various components associated with the high band block 106. Various examples are described herein in the context of such a high band block (106); however, it will be understood that one or more of other band blocks (e.g., the low band block 104) can also be implemented in a single die.

In the example context of the high band block 106, a single die can include at least a single-pole-double-throw (SPDT) T/R switch (112), a PA (110), and an LNA (114) with a bypass attenuator. In some embodiments, both switch-LNA and PA can be based on SiGe BiCMOS technology. It will be understood that the T/R switch 112 can include other numbers of pole(s) and/or throw(s).

In the foregoing SiGe BiCMOS based single-die design, the PA can be implemented as a SiGe PA that integrates some or all of matching networks, filters, regulator and bias circuits, power detector, and CMOS compatible enable circuitry. In some embodiments, the PA can be controlled by an on-chip temperature and voltage compensated bias control circuits.

In the context of the example high band block 106 shown in FIG. 1, the Tx path can be configured to operate in a range that includes 4.9 to 5.9 GHz, and deliver a gain greater than 30 dB. When configured for 802.11ac operations, the Tx path can deliver, for example, greater than 15 dBm with −40 dB DEVM and current consumption less than 190 mA, and greater than 17 dBm with −35 dB DEVM and current consumption less than 210 mA, thereby meeting the linearity requirements of 256-QAM 802.11ac. The example feature of less than −40 dB low back-off DEVM can support, for example, 1024-QAM high linearity applications.

The Tx path design can also be configured to be insensitive to duty cycles and modulation signal bandwidths used in 802.11n and 802.11ac communications. For low power applications, the Tx path can be configured to step down the linear output power with similar linearity as in the normal full power mode. As described herein, the integrated log-detector can increase the dynamic range of the transmit power control.

In the context of the example high band block 106 shown in FIG. 1, the Rx path can be configured to include a gain greater than 15 dB for the LNA in the range of 4.9 to 5.9 GHz, with a noise figure (NF) less than 2.8 dB and 9 mA current consumption. In some embodiments, the Rx path can also include, for example, an 8 dB bypass attenuator of 24 dBm input third order intercept (IIP3), and such a bypass attenuator can prevent the receiver from over-stress under high field illumination conditions.

In some implementations, some or all of the features as described herein can significantly simplify the dual-band 802.11ac radio front-end designs and enable the higher linearity WLAN radio designs.

Figure 2:
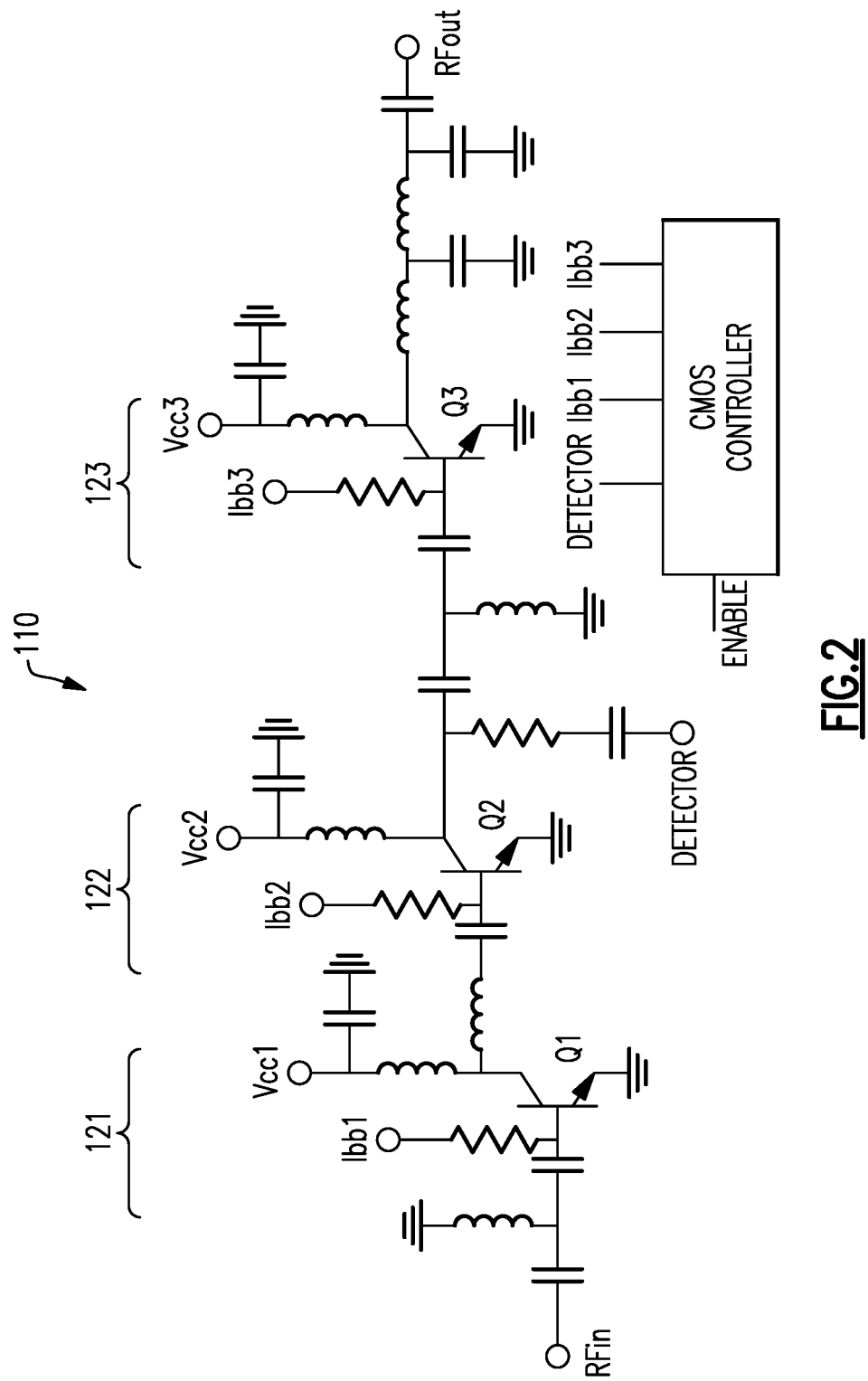
FIG. 2 shows an example power amplifier that can be implemented on a semiconductor die to provide one or more band block functionalities of the FE system of FIG. 1.
Figure 3:
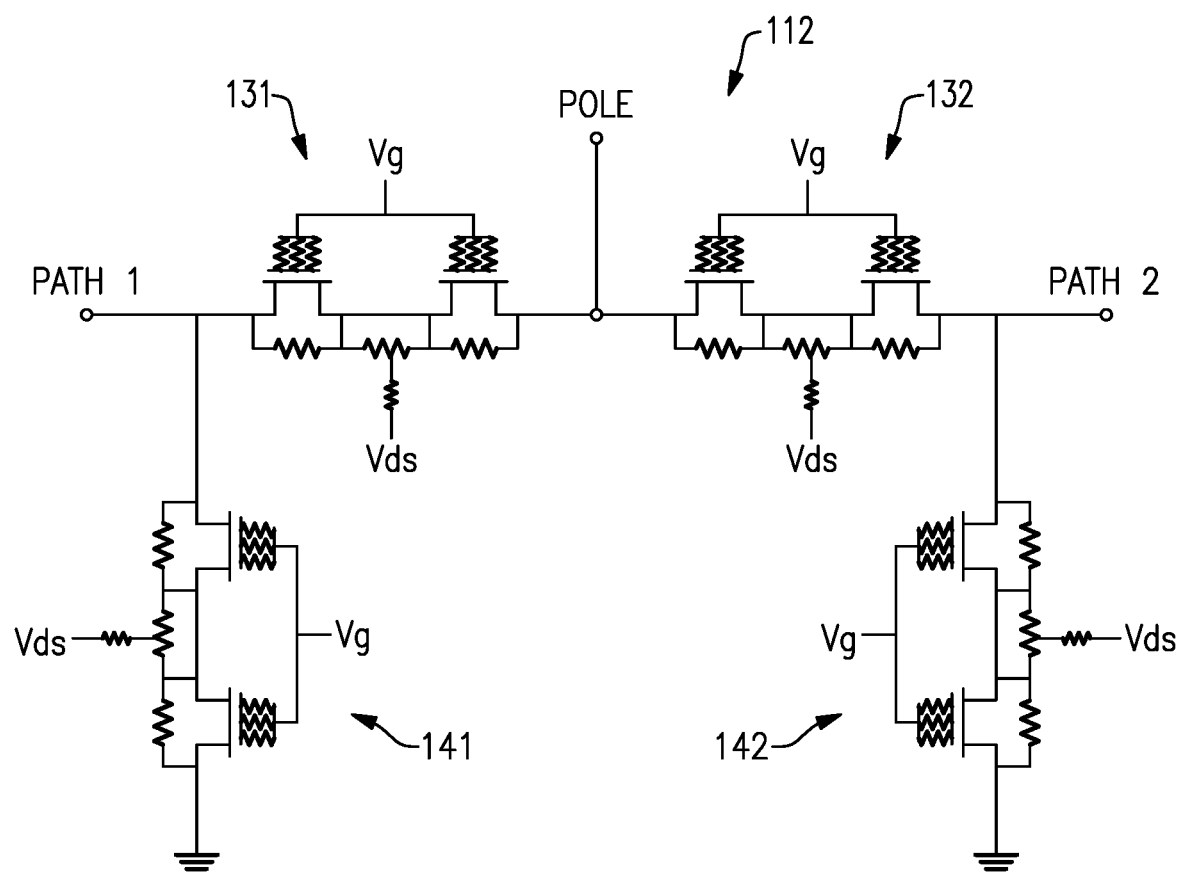
FIG. 3 shows an example transmit/receive switch that can be implemented on the same semiconductor die associated with the power amplifier of FIG. 2.
Figure 4:
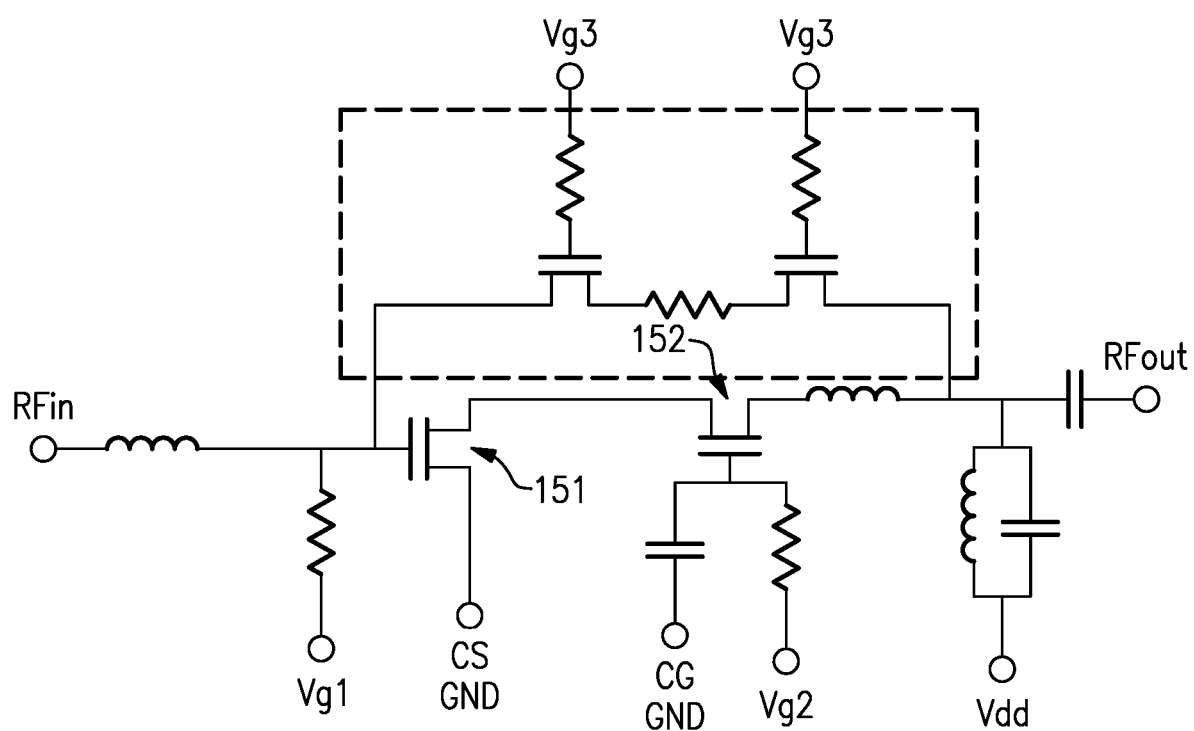
FIG. 4 shows an example low-noise amplifier (LNA) that can be implemented on the same semiconductor die associated with the power amplifier of FIG. 2.

FIGS. 2-4 show examples of how the PA 110, the T/R switch 112, and the LNA 114 of the example high band FEIC design (106) of FIG. 1 can be implemented.

As shown in FIG. 2, the example PA 110 can be implemented as a 3-stage amplifier. Such stages are generally indicated as 121, 122, 123. The first stage 121 is shown to include an amplifying transistor Q1 configured to receive an input signal through its base and generate an amplified signal through its collector. The amplifying transistor Q1 is shown to receive its bias signal at its base from a node Ibb1, and a supply voltage at its collector from a node Vcc1. The second stage 122 is shown to include an amplifying transistor Q2 configured to receive an input signal through its base and generate an amplified signal through its collector. The amplifying transistor Q2 is shown to receive its bias signal at its base from a node Ibb2, and a supply voltage at its collector from a node Vcc2. The third stage 123 is shown to include an amplifying transistor Q3 configured to receive an input signal through its base and generate an amplified signal through its collector. The amplifying transistor Q3 is shown to receive its bias signal at its base from a node Ibb3, and a supply voltage at its collector from a node Vcc3.

It is noted that a significant consideration for using a 3-stage a-band PA includes a feature where many 802.11ac transceivers cannot deliver sufficient linear output power directly to corresponding antennas. Insertion of a high gain PA before the antenna allows the transmitter to operate at the linear output levels. In the PA 110 as described herein, the PA can be managed by an integrated CMOS controller providing, for example, reference currents for current mirrors, low power mode, and on/off control.

During high data throughput WLAN communication operations, the PA is frequently enabled and disabled by a pulsing trigger to reduce current consumption. Such an operating configuration typically introduces a problem of dynamic variation in the amplifier's key figures of merit including linearity and gain. The amplitude distortion of the preamble in the first few microseconds of the amplified data stream typically will result in degraded modulation quality. In some embodiments, the PA 110 as described herein can utilize system and method of pre-bias for rapid power amplifier response correction as described in U.S. Pat. No. 8,824,983, the disclosure of which is hereby expressly incorporated by reference herein in its entirety. Among others, such a technique can mitigate thermal difference between the PA stages, which results in little or no degradation in both linearity and gain under dynamic mode operations.

As shown in the example PA of FIG. 2, the SiGe PA design on-chip matching networks. Such on-chip matching networks can be designed and implemented by, for example, use of measurement based transistor models and large-scale electromagnetic-based models to yield significantly enhanced accuracy of design simulations. In some embodiments, out-of-band rejection filtering circuit(s) can be integrated in the input matching network and first and second stage inter-stage matching networks. The L-C networks of a dual-pole matching network can also effectively reduce the harmonic emissions.

As shown in FIG. 3, the example T/R switch 112 can be implemented as a single-pole-double-throw (SPDT) switch. The pole of such a switch can be coupled with the diplexer 108 in the example of FIG. 1 (e.g., in the Hi node between the high band block 106 and the diplexer 108).

The first path (Path 1) can include a series circuit 131 having a plurality of FETs arranged in series. The gates, sources, and drains of such FETs can be biased as shown to allow the series circuit 131 to be turned ON for passing of an RF signal, and to be turned OFF to block passage of an RF signal. The Path 1 node can be the first of the two throws, and can be coupled to the LNA (114 in FIG. 1).

In the example of FIG. 3, the Path 1 node can be coupled to an AC ground through a shunt circuit 141 having a plurality of FETs arranged in series. The gates, sources, and drains of such FETs can be biased as shown to allow the shunt circuit 141 to be turned ON when the corresponding series circuit 131 is OFF, and to be turned OFF when the series circuit 131 is ON. Such a shunt circuit can, for example, improve isolation between the Path 1 node and other nodes of the T/R switch 112.

Similarly, the second path (Path 2) can include a series circuit 132 having a plurality of FETs arranged in series. The gates, sources, and drains of such FETs can be biased as shown to allow the series circuit 132 to be turned ON for passing of an RF signal, and to be turned OFF to block passage of an RF signal. The Path 2 node can be the second of the two throws, and can be coupled to the PA (110 in FIG. 1).

In the example of FIG. 3, the Path 2 node can be coupled to an AC ground through a shunt circuit 142 having a plurality of FETs arranged in series. The gates, sources, and drains of such FETs can be biased as shown to allow the shunt circuit 142 to be turned ON when the corresponding series circuit 132 is OFF, and to be turned OFF when the series circuit 132 is ON. Such a shunt circuit can, for example, improve isolation between the Path 2 node and other nodes of the T/R switch 112.

The SPDT switch shown in FIG. 3 can be configured to support high linearity and low loss RF paths. For higher data rate and wider bandwidth operation, intermodulation can be an important design parameter. To linearize a given switch path, it is desirable to have the voltage waveforms across each FET in a stack be evenly distributed.

In the example of FIG. 3, two multi-gate MOS switch FETs are shown to be implemented to construct both series and shunt paths for each switch throw to minimize or reduce insertion loss and maximize or increase isolation at high frequency. When the parasitic capacitance of multiple stacked FETs in a shunt path is well designed and balanced, the RF voltage swing can be evenly distributed across each drain-source FET junction. In some embodiments, other important design criteria can include, for example, choice of FET width and number of FET stacks.

The maximum transmit power can be calculated or estimated by an equation $$P_{max}(dBm) = 10\log_{10}\left(\frac{[n(Vgs + Vth) \times 2]^2}{2 \times Z_o}\right)^2 \quad (1)$$

where $Z_o$ represents a characteristic impedance of the measurement system, Vgs represents a control voltage difference between the gate and source (or drain), Vth represents a threshold voltage of the switch FET, and n represents a number of cascaded switch FET.

As shown in FIG. 4, the example LNA 114 can be implemented in a cascode configuration having a first transistor 151 configured to operate as a common source device, and a second transistor 152 configured to operate as a common gate device. More particularly, an input RF signal is shown to be provided from a node RFin to a gate of the first transistor 151, and the amplified signal through shown to be output through its drain. The source of the first transistor 151 is shown to be coupled to ground. The amplified signal from the drain of the first transistor 151 is shown to be provided to a source of the second transistor 152 for further amplification, and such further amplified signal is shown to be output through the drain of the second transistor 152. The gate of the second transistor 152 is shown to be coupled to ground. The first and second transistors 151, 152 are shown to be biased from respective nodes Vg1, Vg2.

In the example of FIG. 4, the LNA 114 is shown to include a bypass circuit generally indicated by the dashed line box. Such a bypass circuit can include two transistors arranged in series with a resistance therebetween. Each of the two transistors is shown to have its gate biased from a node Vg3.

In some embodiments, the foregoing cascode topology of the LNA 114 can be configured to achieve sufficient gain from 4.9 to 5.9 GHz. To reduce the impact of out-of-band interference, two out-of-band trap filters can be implemented to ensure sufficient out-of-band rejections, as shown in FIG. 4. In addition, to avoid saturation of the LNA 114 in the presence of high level receive signals, a bypass attenuator (e.g., 7-dB attenuation) can be implemented as shown.

Figure 5:
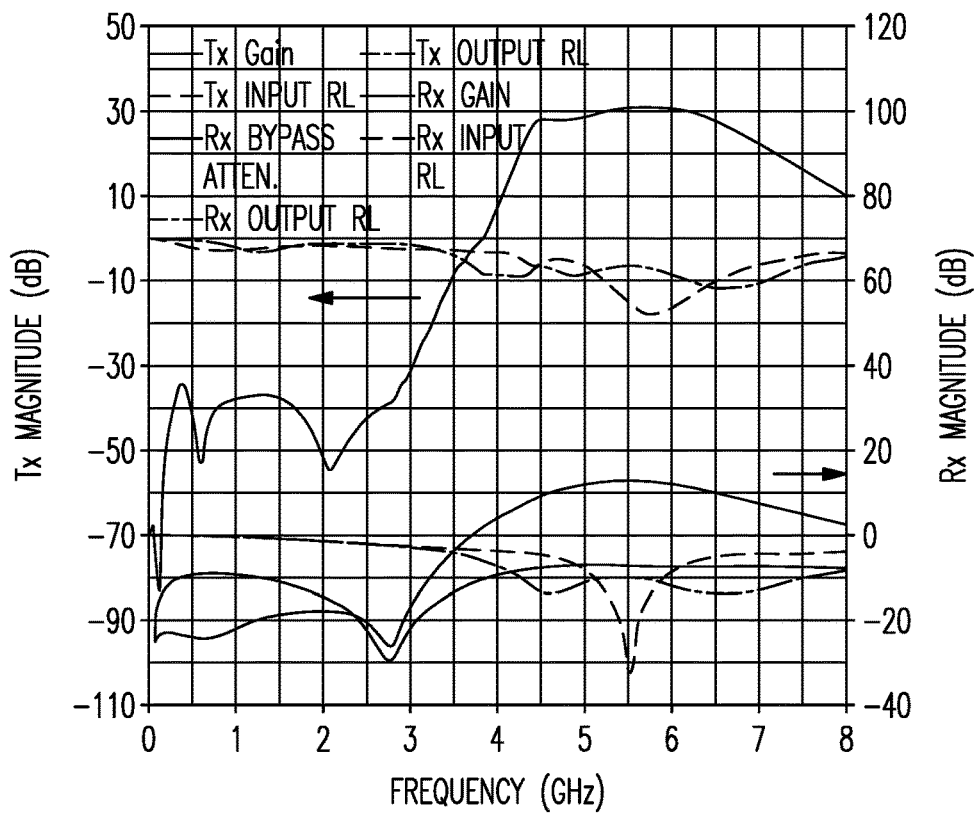
FIG. 5 shows examples of S-parameters of transmit and receive paths in the semiconductor die associated with FIGS. 2-4.

Various measurements associated with the example high band FEIC design (106) of FIG. 1 are shown in FIGS. 5-9. FIG. 5 shows the S-parameters of transmit and receive paths. Curves associated with the transmit path are on the upper portion of FIG. 5 and correspond to the left vertical axis, and curves associated with the receive path are on the lower portion of FIG. 5 and correspond to the right vertical axis. For the receive path curves, the higher solid curve (at frequency higher than 3 GHz) corresponds to Rx gain, and the other solid curve corresponds to Rx bypass attenuation.

Referring to FIG. 5, it is noted that the gain variation over frequency is within 1 dB (between 4.9 to 5.9 GHz) for both the Tx path and the Rx path, with gains greater than 30 dB and 15 dB of gain, respectively.

Figure 6:
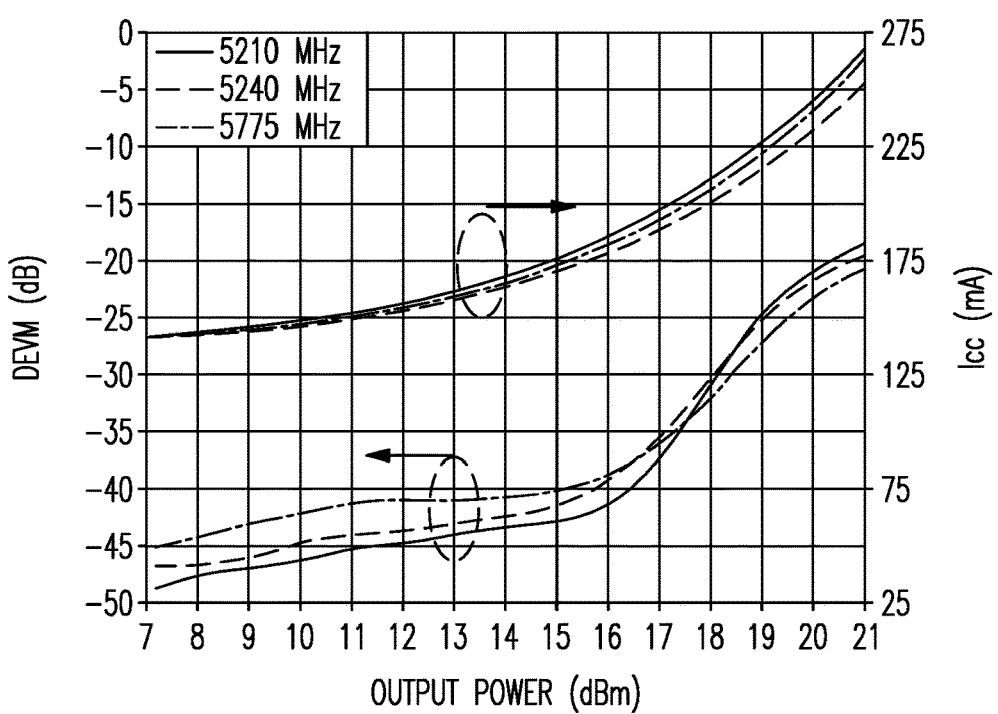
FIG. 6 shows examples of dynamic EVM (DEVM) and current consumption characteristics in the semiconductor die associated with FIGS. 2-4.

The linearity of the transmit path is validated using an 80 MHz 256 QAM 802.11ac VHT80 signal at 433 Mbps and under dynamic mode. As shown in FIG. 6, with a 3.3V supply, the transmit path can deliver greater than 15 dBm with less than −40 dB dynamic EVM and 190 mA current consumption, and greater than 17 dBm at −35 dB dynamic EVM with less than 210 mA current consumption. It is noted that a feature of less than −40 dB back-off DEVM is typically required or desired for many 1024-QAM 802.11 applications.

Figure 7:
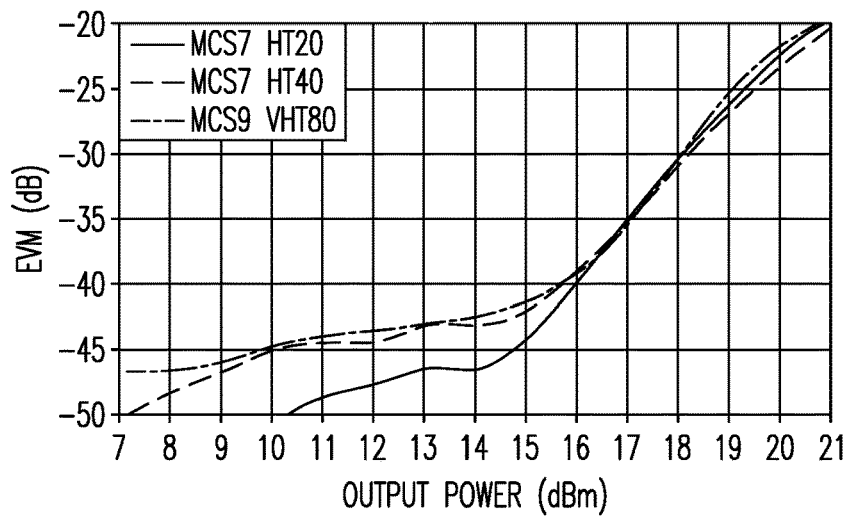
FIG. 7 shows examples of DEVM characteristics for different modulation bandwidths and data rates in the semiconductor die associated with FIGS. 2-4.

To support 802.11ac radio FE designs, the PA is also required or desired to be insensitive to various modulation bandwidths and data rates. The example design as described herein is validated with a 20 MHz MCS7 HT20, a 40 MHz MCS7 HT40, and an 80 MHz MCS9 VHT80 test signals as shown in FIG. 7. The variations between modulations are only observed at the DEVM level below −40 dB.

Figure 8:
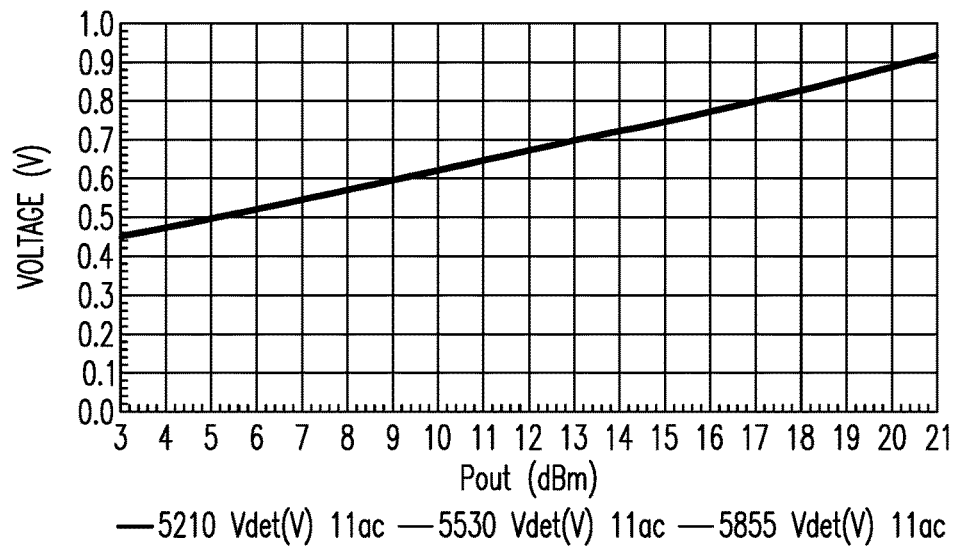
FIG. 8 shows examples of power detector response in the semiconductor die associated with FIGS. 2-4.

Another important application for an 802.11ac radio is the use of long data transmission, which can increase the data throughput rate. The Tx path is tested against the regular data length of a few hundred microseconds and a 4 mS long data length. The measured Tx path showed no significant degradation between the short data and long data length transmissions. When the PA is transmitting a long data frame, the transient gain of the PA typically will vary with time due to the transistor junction temperature rising with time. The integrated CMOS controller as described herein can effectively compensate such PA temperature changes, thereby minimizing or reducing impact on linearity. The power detector response is shown in FIG. 8, with a substantially linear response for the entire operational range, which ensure the dynamic range of the power control and power control accuracy.

Figure 9:
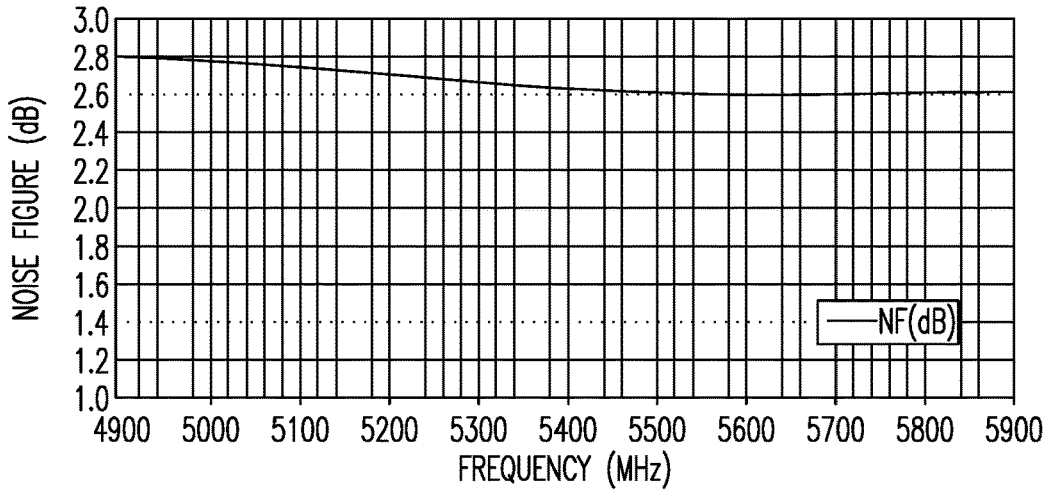
FIG. 9 shows an example of noise figure along the receive path in the semiconductor die associated with FIGS. 2-4.

Referring to FIG. 9, it is noted that the Rx path has 15 dB gain and NF of 2.6 to 2.8 dB with a current consumption of 8 mA. Due to the on-chip out-of-band rejection filter, the band selectivity between b/g band and a-band is measured to be greater than 25 dB, which can provide immunity from a b/g band jamming signal level up to 10 dBm without any degradation of the 5-6 GHz in-band NF. The IIP3 is measured at 3 dBm for the LNA mode. The bypass path attenuation is 8 dB with IIP3 of 24 dBm.

As described herein by examples, a highly integrated single chip 4.9-5.9 GHz WLAN FEIC for 802.11ac applications can be realized in, for example, 1.6 mm² area and implemented in a 1.7×2.0×0.33 mm³ package. Such an FEIC can be based on SiGe BiCMOS process for both PA and the switched LNA. With an example 3.3 V supply, the transmit path can achieve greater than 30 dB gain with greater than 17 dBm output power at −40 dB DEVM, and greater than 17 dBm output power at −35 dB DEVM with MCS9 VHT-80 test signals, while consuming less than 210 mA. The feature of less than −40 dB back-off DEVM can enable, for example, 1024-QAM 802.11 applications. The integrated log detector can ensure accurate power control and increase the dynamic range for the Tx path. The receive path can have an integrated 15 dB LNA with less than 2.8 dB NF with IIP3 of 3 dBm and an 8-dB bypass attenuator with IIP3 of 24 dBm. Some of all of the foregoing features can greatly simplify dual-band radio FE designs and enable the reduction of the radio board form factor and consequently result in simple constructions of complex dual-band MIMO radios for 802.11ac applications and many higher linearity WLAN radios.

It will be understood that one or more features of the present disclosure can also be utilized for RF applications, including other WLAN applications. It will also be understood that devices having one or more features as described herein can be implemented with different dimensions.

Figure 10:
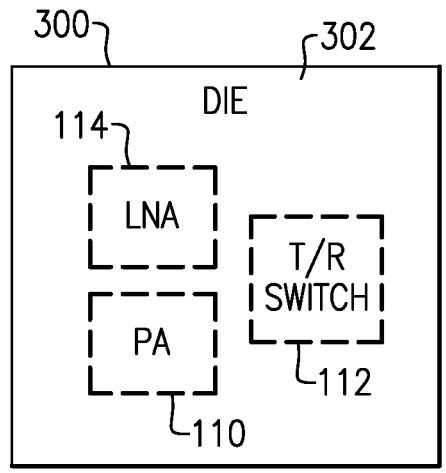
FIG. 10 shows that in some embodiments, a front-end integrated circuit (FEIC) having one or more features as described herein can be implemented in a single semiconductor die.

FIG. 10 shows that in some embodiments, an FEIC (e.g., a WLAN FEIC) having one or more features as described herein can be implemented in a single semiconductor die 300. Such a die can include a substrate 302 configured to allow SiGe BiCMOS processes for formation of a PA 110, an LNA 114, and a T/R switch 112. It will be understood that such PA, LNA, and/or T/R switch can include related circuits as described herein.

Figure 11A:
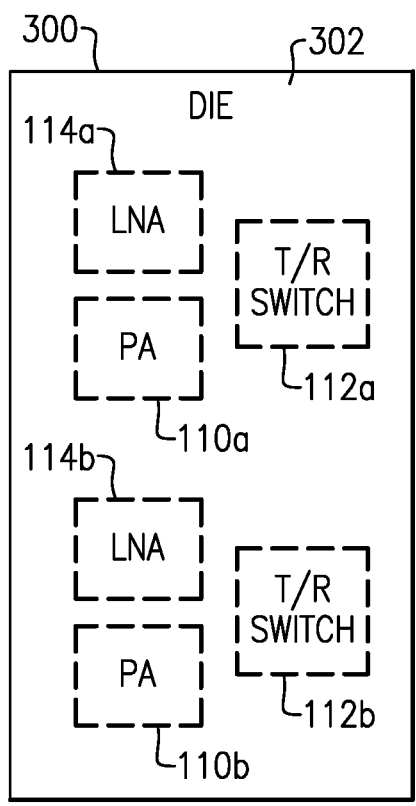
FIG. 11A shows that in some embodiments, a semiconductor die can include more than one group of power amplifier, low-noise amplifier and transmit/receive switch combinations implemented on its substrate.

FIG. 11A shows that in some embodiments, a semiconductor die 300 such as that of FIG. 10 can include more than one group of PA, LNA and T/R switch combinations implemented on a substrate 302. For example, the first group can include a first PA 110a, a first LNA 114a, and a first T/R switch 112a implemented on the substrate 302 and configured to provide FEIC functionality for, for example, one or more WLAN bands. The second group can include a second PA 110b, a second LNA 114b, and a second T/R switch 112b implemented on the same substrate 302 and configured to provide FEIC functionality for, for example, one or more other WLAN bands.

Figure 11B:
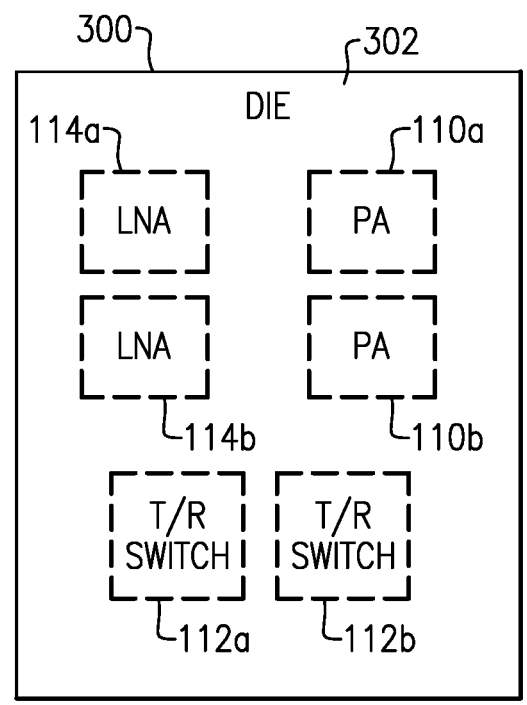
FIG. 11B shows that in some embodiments, functionally similar components can be implemented generally together on a substrate of a semiconductor die.

In the example of FIG. 11A, various components of each group are shown to be generally clustered together on the substrate 302. It will be understood that such an arrangement is an example, and not necessarily a requirement. It will also be understood that other arrangements of components can also be implemented. For example, FIG. 11B shows that in some embodiments, functionally similar components can be implemented generally together on a substrate 302 of a semiconductor die 300. In the example of FIG. 11B, first and second PAs 110a, 110b are shown to be implemented relatively close to each other on the substrate 302. Similarly, first and second LNAs 114a, 114b are shown to be implemented relatively close to each other on the substrate 302. Similarly, first and second T/R switches 112a, 112b are shown to be implemented relatively close to each other on the substrate 302.

In some embodiments, some or all of functionalities associated with each of some or all of the PAs 110a, 110b, the LNAs 114a, 114b, and the T/R switches 112a, 112b can be combined and implemented on the substrate.

Figure 12:
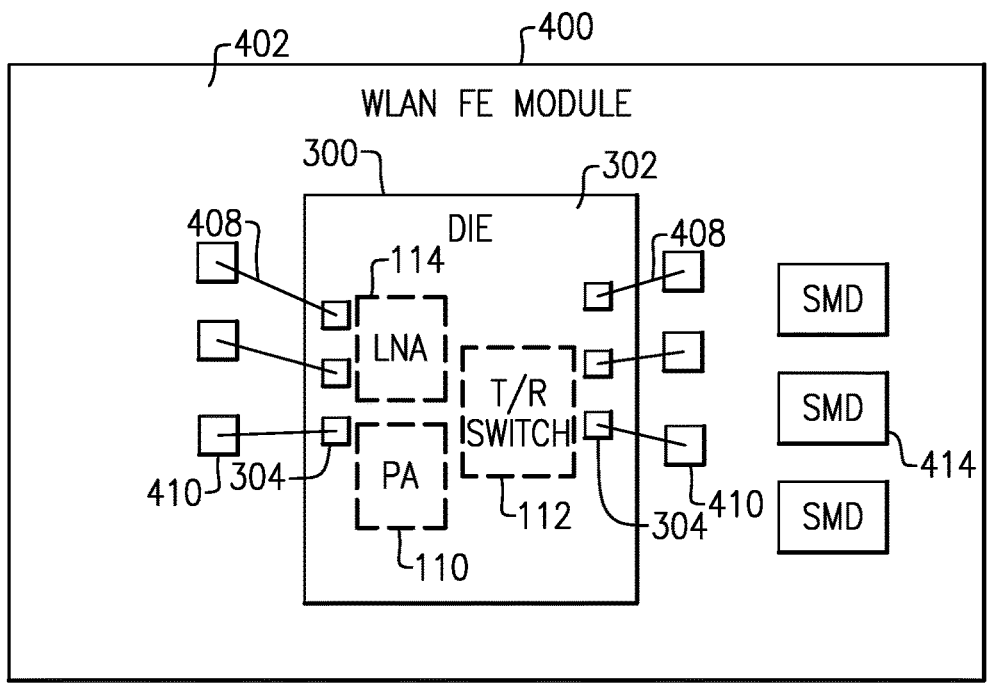
FIG. 12 depicts an example module having one or more features as described herein.

In some implementations, one or more features described herein can be included in a module. FIG. 12 depicts an example module 400 having a packaging substrate 402 that is configured to receive a plurality of components. In some embodiments, such components can include a die 300 having one or more features as described herein. For example, the die 300 can include a semiconductor die 302, and implemented thereon are a PA 110, an LNA 114, and a T/R switch 112. A plurality of connection pads 304 can facilitate electrical connections such as wirebonds 408 to connection pads 410 on the packaging substrate 402 to facilitate passing of various power and signals to and from the die 300.

In some embodiments, other components can be mounted on or formed on the packaging substrate 402. For example, one or more surface mount devices (SMDs) (414) can be implemented. In some embodiments, the packaging substrate 402 can include a laminate substrate.

In some embodiments, the module 400 can also include one or more packaging structures to, for example, provide protection and facilitate easier handling of the module 400. Such a packaging structure can include an overmold formed over the packaging substrate 402 and dimensioned to substantially encapsulate the various circuits and components thereon.

It will be understood that although the module 400 is described in the context of wirebond-based electrical connections, one or more features of the present disclosure can also be implemented in other packaging configurations, including flip-chip configurations.

In some embodiments, the module 400 of FIG. 12 can be, for example, an FE module such as a WLAN FE module. It will be understood that one or more features of the present disclosure can also be implemented in other types of RF modules.

Figure 13:
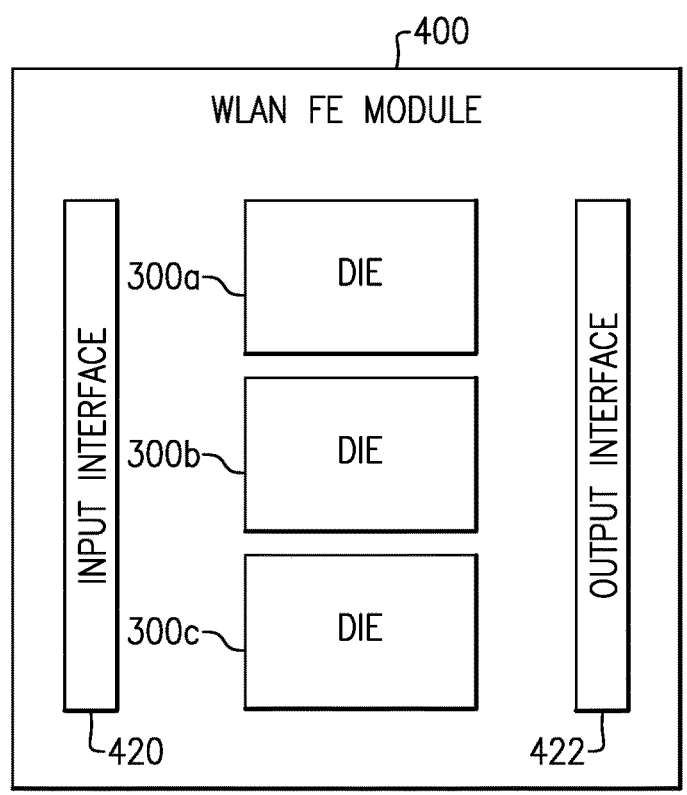
FIG. 13 shows an example module having a multiple-input multiple-output (MIMO) functionality.

FIG. 13 shows that in some embodiments, a WLAN FE module 400 can include a plurality of semiconductor die each having one or more features as described herein. For example, three die 300a, 300b, 300c are shown to be implemented in the module 400, and each of the three die can be similar to the example die described herein in reference to FIGS. 10-12. Such die can facilitate, for example, MIMO functionality for the WLAN FE module 400. Such MIMO functionality can be facilitated by an input interface 420 and an output interface 422.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 14:
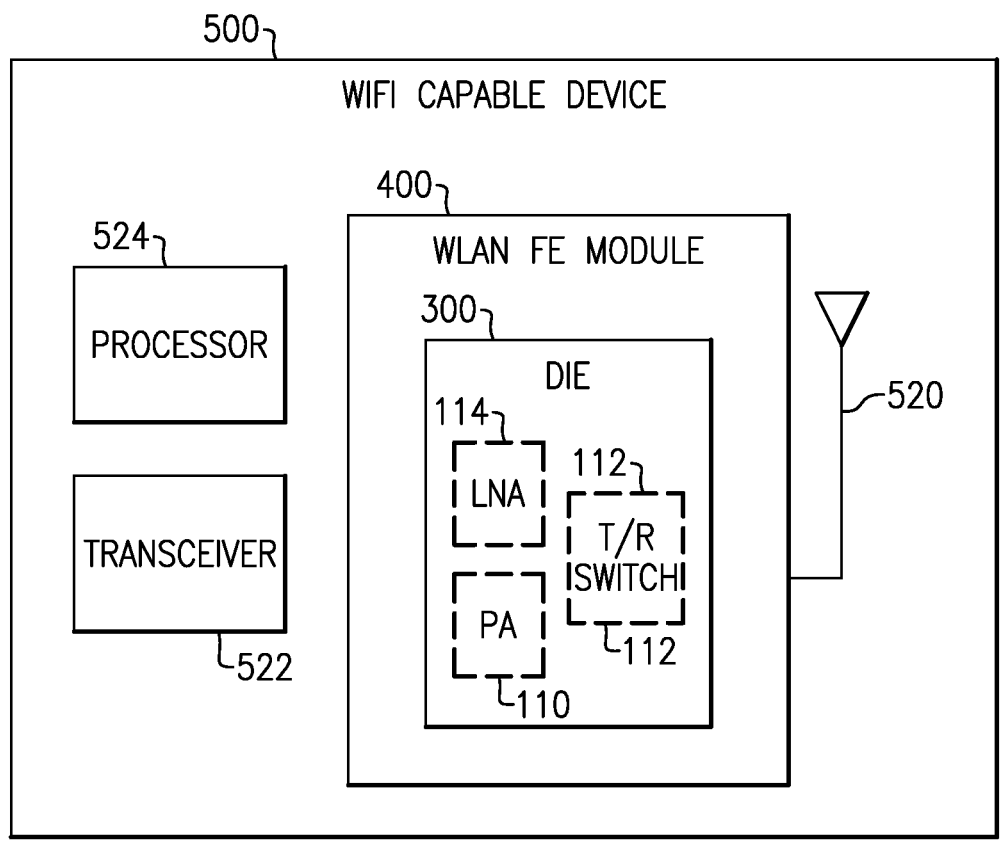
FIG. 14 shows an example wireless device having one or more features as described herein.

FIG. 14 shows that a semiconductor die 300 having one or more features as described herein can be included in a wireless device such as a WLAN capable device 500. As described herein, such a semiconductor die can include a PA 110, an LNA 114, and a T/R switch 112. Such a semiconductor die can be included in a WLAN FE module 400.

In the example of FIG. 14, the wireless device 500 can also include a transceiver 522 for generating an RF signal to be amplified by the PA 110 and transmitted through an antenna 520, and for processing a received RF signal received through the antenna 520 and amplified by the LNA 114. The wireless device 500 can also include a processor 524 configured to provide various control functionalities.

In some embodiments, an FE module having one or more features as described herein can be implemented in a wireless device having, for example, cellular functionalities.

Figure 15:
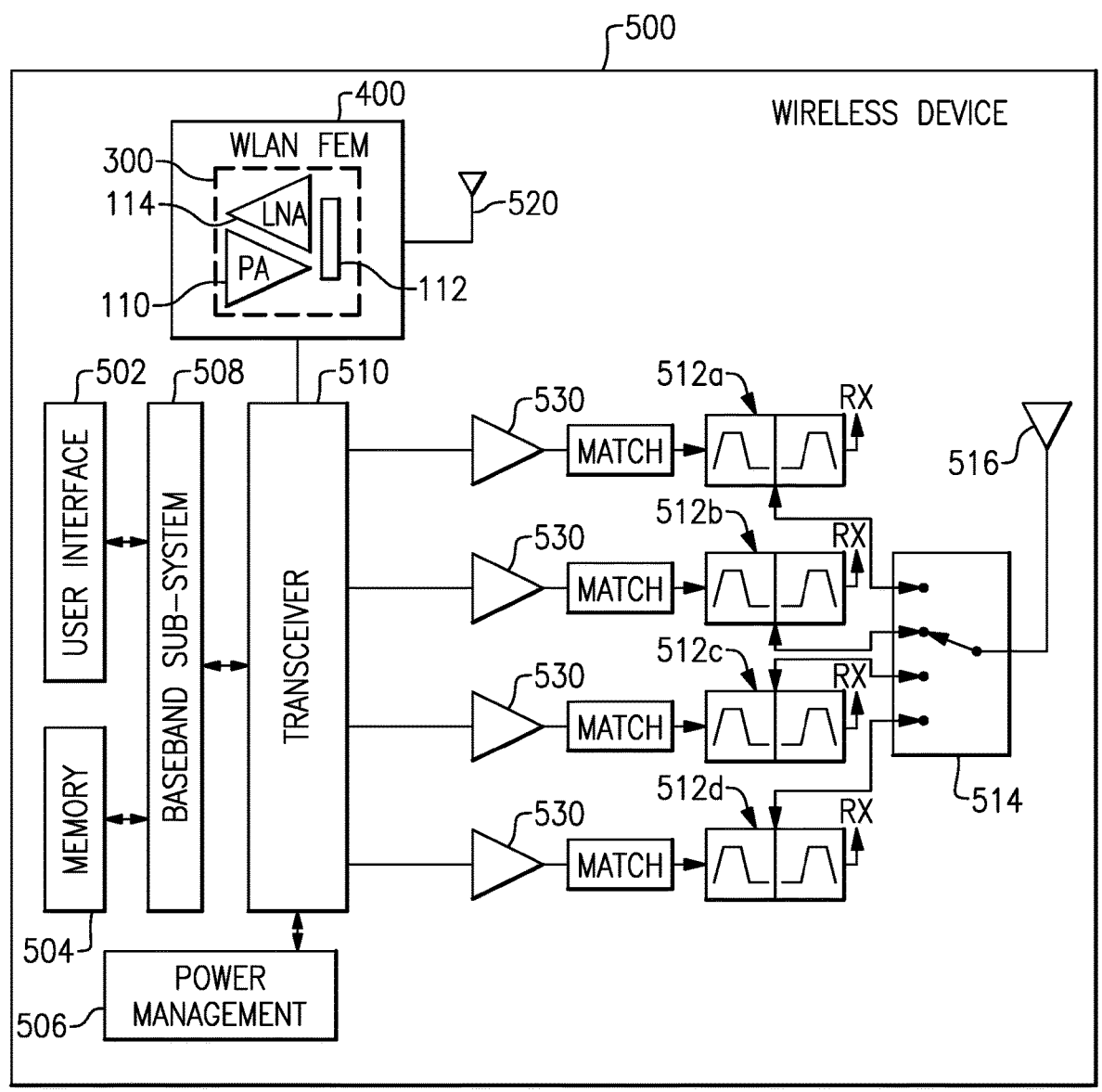
FIG. 15 shows another example wireless device having one or more features as described herein.

FIG. 15 schematically depicts an example wireless device 500 having one or more advantageous features described herein. A WLAN FE module 400 having a die 300 with a PA 110, an LNA, and a T/R switch 112 can be included in the wireless device 500. Such a WLAN FE module can facilitate transmission of an amplified RF signal through an antenna 520, and processing of a received RF signal from the antenna 520. Such an RF signal to be transmitted can be generated by a transceiver 510; and the same transceiver can process the received RF signal amplified by the WLAN FE module 400.

In some embodiments, the transceiver 510 can be configured to also generate a cellular RF signal to be transmitted, and process a received cellular RF signal. One or more PAs 530 can receive their respective RF signals from the transceiver. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 530 are shown to be matched and routed to an antenna 516 via their respective duplexers 512a-512d and a band-selection switch 514. The band-selection switch 514 can be configured to allow selection of, for example, an operating band or an operating mode. In some embodiments, each duplexer 512 can allow transmit and receive operations to be performed simultaneously using a common antenna (e.g., 516). In FIG. 15, received signals are shown to be routed to "Rx" paths that can include, for example, a low-noise amplifier (LNA).

In the various examples described herein, FEICs are described in the example context of 4.9-5.9 GHz WLAN frequency range. However, it will be understood that one or more features of the present disclosure can also be implemented with other WLAM frequencies and/or frequency ranges, including any channels using IEEE 802.11 protocols. Such channels can be parts of, for example, 2.4 GHz, 3.6 GHz, 4.9 GHz, 5 GHz, and 5.9 GHz bands.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor die comprising:
a silicon germanium substrate;
a first amplifier implemented on the silicon germanium substrate and configured for transmit operation, the first amplifier including a first stage, a second stage, and a third stage, each stage including an amplifying transistor configured to receive a respective input signal through its base and generate a respective amplified signal through its collector, such that an input signal for the first amplifier is provided to the base of the first amplifying transistor, and an amplified signal from the first amplifier is provided through the collector of the third amplifying transistor; and
a second amplifier implemented on the silicon germanium substrate and configured for receive operation.

2. The semiconductor die of claim 1 wherein the first amplifier is a power amplifier.

3. The semiconductor die of claim 1 wherein the second amplifier is a low-noise amplifier.

4. The semiconductor die of claim 1 further comprising a switch implemented on the silicon germanium substrate and configured to support the transmit and receive operations with the first and second amplifiers, respectively.

5. The semiconductor die of claim 1 wherein each of the transmit operation and the receive operation includes a respective wireless local area network operation.

6. The semiconductor die of claim 5 wherein the wireless local area network transmit and receive operations include a frequency range of 4.9 GHz to 5.9 GHz.

7. The semiconductor die of claim 1 wherein the silicon germanium substrate is configured to allow implementation of silicon germanium BiCMOS process technology.

8. The semiconductor die of claim 1 further comprising a CMOS controller configured to provide control functionality for at least the first amplifier.

9. The semiconductor die of claim 1 further comprising one or more bias circuits configured to provide bias signals to some or all of the first, second and third stages of the first amplifier.

10. The semiconductor die of claim 1 further comprising a power detector configured to measure power associated with the first amplifier.

11. The semiconductor die of claim 1 wherein the second amplifier is implemented in a cascode configuration with a first transistor and a second transistor.

12. The semiconductor die of claim 11 wherein the first transistor is configured to operate as a common source device, and the second transistor configured to operate as a common gate device, such that an input signal is provided to a gate of the first transistor and a partially amplified signal is output through a drain of the first transistor, and the partially amplified signal from the drain of the first transistor is provided to a source of the second transistor for further amplification and output through a drain of the second transistor.

13. The semiconductor die of claim 12 wherein the second amplifier includes a bypass circuit implemented between the gate of the first transistor and the drain of the second transistor, the bypass circuit including first and second switch transistors arranged in series with an attenuation resistance implemented between the first and second switch transistors.

14. A radio-frequency module comprising:
a packaging substrate configured to receive a plurality of components; and
a front-end integrated circuit implemented on a die that is mounted on the packaging substrate, the die including a silicon germanium substrate and a first amplifier implemented on the silicon germanium substrate and configured for transmit operation, the first amplifier including a first stage, a second stage, and a third stage, each stage including an amplifying transistor configured to receive a respective input signal through its base and generate a respective amplified signal through its collector, such that an input signal for the first amplifier is provided to the base of the first amplifying transistor, and an amplified signal from the first amplifier is provided through the collector of the third amplifying transistor, the die further including a second amplifier implemented on the silicon germanium substrate and configured for receive operation.

15. The radio-frequency module of claim 14 wherein the transmit and receive operations include wireless local area network transmit and receive operations, respectively, in a frequency range of 4.9 GHz to 5.9 GHz.

16. A wireless device comprising:
a transceiver;
a front-end integrated circuit in communication with the transceiver and implemented on a die, the die including a silicon germanium substrate and a first amplifier implemented on the silicon germanium substrate and configured for transmit operation, the first amplifier including a first stage, a second stage, and a third stage, each stage including an amplifying transistor configured to receive a respective input signal through its base and generate a respective amplified signal through its collector, such that an input signal for the first amplifier is provided to the base of the first amplifying transistor, and an amplified signal from the first amplifier is provided through the collector of the third amplifying transistor, the die further including a second amplifier implemented on the silicon germanium substrate and configured for receive operation; and
one or more antennas in communication with the die and configured to support the transmit and receive operations.

17. The wireless device of claim 16 wherein the transmit and receive operations include wireless local area network transmit and receive operations, respectively, in a frequency range of 4.9 GHz to 5.9 GHz.

18. The wireless device of claim 17 further comprising a cellular front-end integrated circuit and one or more cellular antennas configured for cellular transmit and receive operations.

* * * * *